United States Patent [19]
Cygan

[11] Patent Number: 5,426,395
[45] Date of Patent: Jun. 20, 1995

[54] METHOD AND APPARATUS FOR PROTECTING POWER AMPLIFIERS FROM EXCESSIVE OPERATING POWER LEVELS

[75] Inventor: Lawrence F. Cygan, Schaumburg, Ill.

[73] Assignee: Motorola, Inc., Schaumburg, Ill.

[21] Appl. No.: 55,587

[22] Filed: May 3, 1993

[51] Int. Cl.6 .......................... H03G 3/20; H03G 3/30; H03G 3/00
[52] U.S. Cl. .................. 330/207 P; 330/290; 330/291; 330/298
[58] Field of Search ................ 330/207 P, 271, 290, 330/291, 298, 69

[56] References Cited

U.S. PATENT DOCUMENTS

| | | | |
|---|---|---|---|
| 4,563,775 | 1/1986 | Yokosuka | 330/207 P |
| 4,803,440 | 2/1989 | Hotta et al. | 330/284 |
| 5,204,637 | 4/1993 | Trinh | 330/284 |

Primary Examiner—William L. Sikes
Assistant Examiner—Fetsum Abraham
Attorney, Agent, or Firm—Nedra D. Karim; Timothy W. Markison; Susan L. Lukasik

[57] ABSTRACT

Power amplifiers, which include a feedback element, may be protected from excessive operating power levels by adjusting the feedback element to reduce the drive signals to the power elements. This is accomplished by sensing the output power of the power amplifier to produce a sensing signal. When the sensing signal exceeds a predetermined threshold, a feedback element is adjusted to produce an increased feedback signal. The increased feedback signal is subtracted from an input signal, thus decreasing the drive signal. With the drive signal reduced, the output power is reduced proportional to the adjustment of the feedback element.

24 Claims, 2 Drawing Sheets

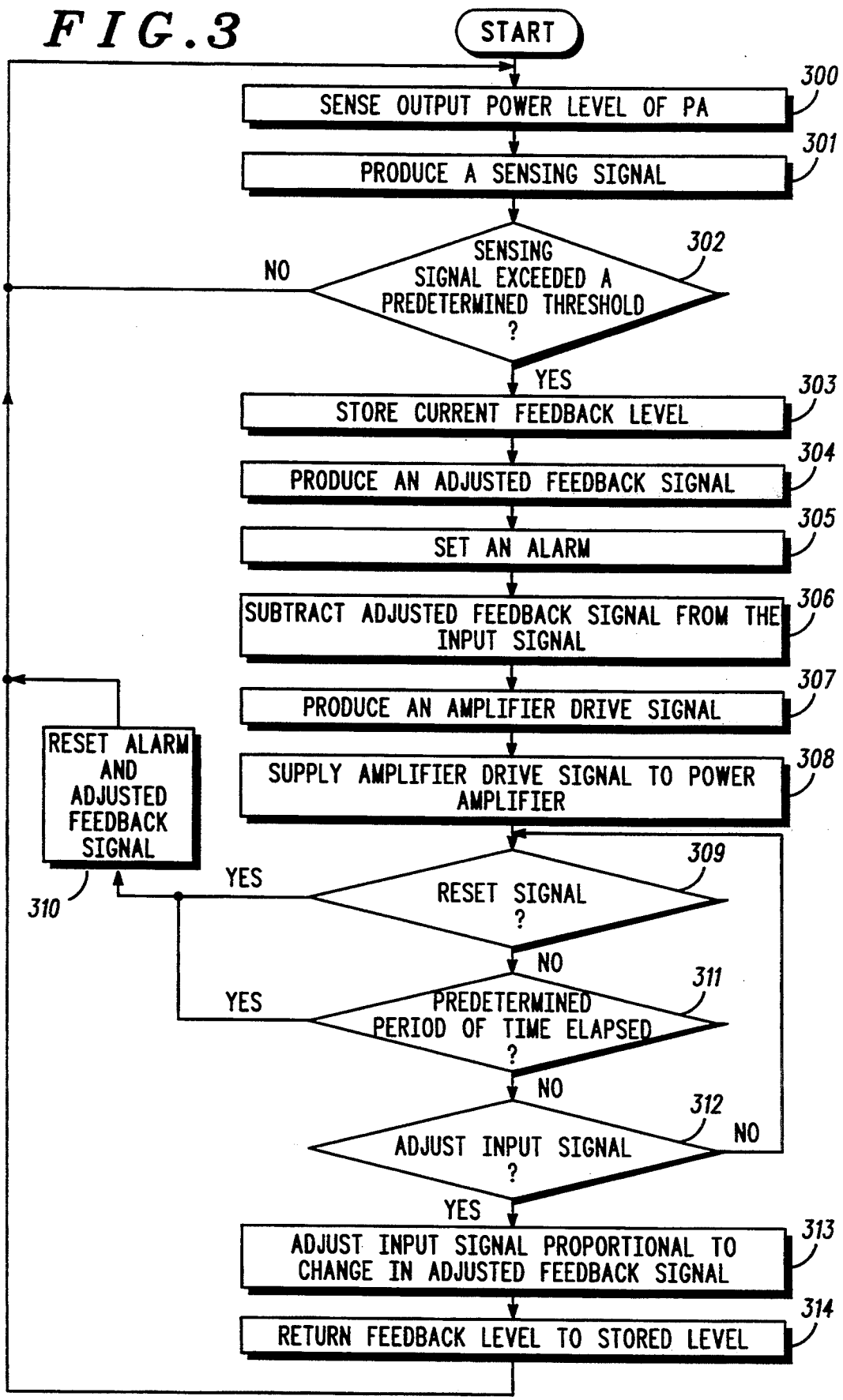

METHOD AND APPARATUS FOR PROTECTING POWER AMPLIFIERS FROM EXCESSIVE OPERATING POWER LEVELS

FIELD OF THE INVENTION

This invention relates generally to protection of power amplifiers and, in particular, to protection of power amplifiers from excessive operating power levels.

BACKGROUND OF THE INVENTION

Power amplifiers are used in transmitters to rebroadcast, at high power levels, amplitude modulation (AM) signals, frequency modulation (FM) signals, and quadrature amplitude modulation (QAM) signals. As is known, information is carried in the amplitudes of AM and QAM signals. Because of this, transmitters must accurately rebroadcast these signals, thus the power amplifiers within the transmitters must have high fidelity, i.e. linearly rebroadcast the signals they receive.

To maintain linear performance, the power elements (usually transistors) are operated at levels much below their rated output power levels. Thus, to achieve high output power levels, many power amplifiers include cascaded elements, such that the amplified output of one element is the input of the next element. In this manner, a small change in a first stage typically produces a large change in the final stage output. For this reason, the power amplifier utilizes a feedback control loop, which is regulated by a power control circuit, to maintain output power levels.

However, when changes exceed the limits of the feedback control loop, damage can occur to the power elements (transistors). Once damage has occurred, excessive feedback signal levels produce power amplifier instability which results in the destruction of the power amplifier.

Therefore a need exists for a method and apparatus that provides protection of power amplifiers from excessive operating power levels.

BRIEF DESCRIPTION OF THE DRAWINGS

FIG. 3 illustrates a logic diagram that may be used to implement the present invention.

DESCRIPTION OF A PREFERRED EMBODIMENT

Generally, the present invention provides a method and apparatus which protects a power amplifier from destructive operating conditions which may arise as the result of changes in amplifier elements. The protection is accomplished by sensing the output power level, comparing the level to a predetermined reference, and, in the event the reference is exceeded, modifying elements in a signal feedback path which, in turn, reduces the drive signal level applied to the amplifier elements. The power amplifier operates with the reduced drive signal until the apparatus is manually reset or automatically reset. Additionally, the signal source level may be reduced instead of the feedback which prevents unstable and destructive operation of the feedback loop.

Figure 1:
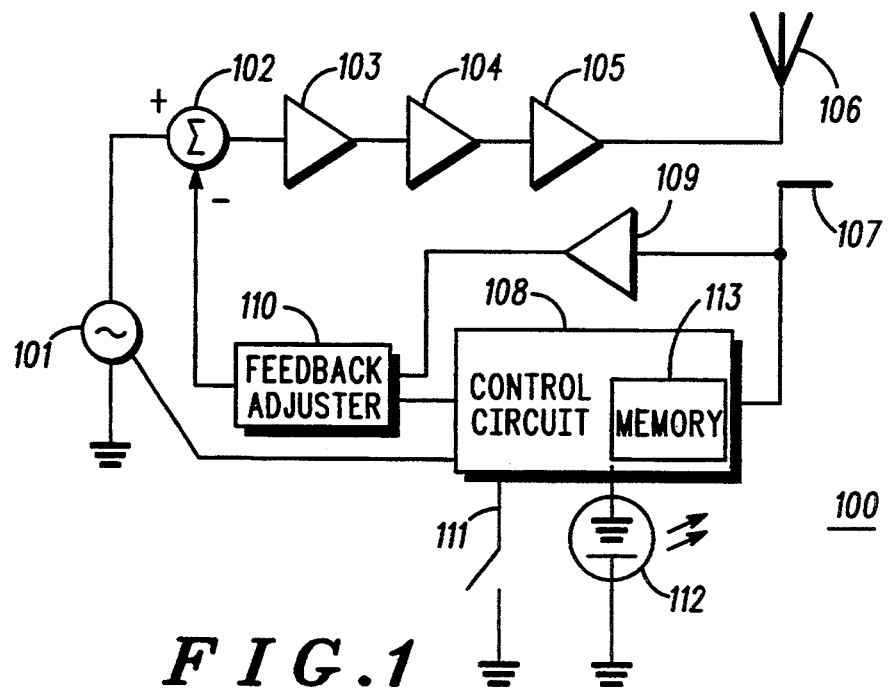
FIG. 1 illustrates a power amplifier in accordance with the present invention.

The present invention can be more fully described with reference to FIGS. 1–3. FIG. 1 illustrates a power amplifier (100) comprising a signal source (101), a summing junction (102), several cascade connected amplifier elements (103–105), an antenna (106), an output signal sampling device (107), a control circuit (108), a gain component (amplifier) (109), a feedback signal adjuster (110), a reset switch (111) and an alarm device (112). The cascaded amplifier elements (103–105) provide an amplified version of the signal source (101) to the antenna (106). Signal feedback elements, the summing junction (102), the output signal sampling device (107), the gain component amplifier (109), and the feedback signal adjuster (110), are configured to enhance the linear amplifying properties of the cascaded amplifier elements (103–105) using known feedback correction techniques. Specifically, in a communication application, these elements form a negative feedback system which reduces the level of unwanted signal power which falls outside the assigned frequency band causing adjacent channel interference. The output signal sampling device (107), which may be a directional coupler or a voltage divider circuit, provides an output sample to the gain component (109) of the feedback loop. The feedback signal adjuster (110) may be realized as a controlled (variable) gain stage or a variable attenuator. The control circuit (108) operates upon the feedback signal adjuster (110) to vary its gain (or attenuation) thereby determining the level of the feedback signal applied at the summing junction (102). At the summing junction (102), the feedback signal from the feedback adjuster is combined with the signal source (101) in opposite polarity, resulting in the subtraction of the two signals. The signal which results from the subtraction is applied to amplifier 103 as a drive signal.

The output sample produced by the output signal sampling device (107) is also fed to the control circuit (108). The sample is rectified and filtered to provide a DC (direct current) level which is compared to a predetermined reference DC level. If the sampled signal exceeds the reference level, the control circuit (108) causes the feedback signal adjuster (110) to increase gain (or decrease attenuation) thereby increasing the feedback signal level, which, in turn, reduces the drive signal to the cascaded amplifier elements (103–105). The state of the feedback signal adjuster is stored in memory (113) of the control circuit prior to adjusting the feedback signal adjuster.

When the power amplifier is operating in a reduced drive state, the control circuit (108) activates the alarm device (112) which provides an indication that the power amplifier is operating in a reduced drive state. The reset switch (111) may be activated either manually, or automatically after a predetermined period of time, by the control circuit (108). The reset event removes the alarm condition and returns the feedback signal adjuster (110) to its previous state which was stored in memory (113).

An alternate operation of the control circuit (108) includes control of the signal source (101). After the feedback signal adjuster (110) is adjusted to produce a drive power reduction, the signal source (101) is directed to reduce its input signal proportional to the feedback signal increase, thereby permitting the feedback signal adjuster (110) to return to its previous state which has been retained in memory (113). This alternate operation of the control circuit (108) offers several advantages. In the event the condition which originally activated the protection circuit persists after reset, the circuit will again be activated. The power amplifier will thus toggle between nominal and reduced drive states until the fault causing condition is removed. If, however, the signal source (101) is reduced as described, operation at reduced drive continues after reset, which in most cases, eliminates reactivation of the protection circuit. In the event the fault condition is still present, reactivation results in a second (cumulative) decrease in signal source output level. The composite effect of controlling the feedback signal adjuster (110) and the signal source (101) in this manner is to ratchet down the source output level until the amplifier output power no longer exceeds the predetermined reference.

Under the alternative mode of operation of the control circuit (108), the alarm device (112) actuation would normally be continued as long as the power amplifier is operating at reduced drive levels, thereby calling attention to the previous existence of a fault condition which has been removed by drive reduction.

A further advantage of the alternative mode of operation of the control circuit (108) is the ability to avoid unstable operation. Known feedback correction art prescribes a maximum level for the feedback signal applied to the summing junction. Excessive feedback signal levels produce power amplifier instability which potentially results in the destruction of the power amplifier, contrary to the objectives of a protection circuit. This stability criterion therefore limits the maximum feedback signal which the feedback signal adjuster (110) may provide. Constraining the feedback signal adjuster (110) to operate in either of two discrete gain states, however, allows for a step decrease in drive power wherein the step increase necessary at the summing junction (102) does not violate the stability criteria. For example, a 3 dB step increase in the feedback signal produced by the feedback signal adjuster (110) will simultaneously have little adverse effect on stability, yet will decrement drive power by 3 dB. When several activations of the protection circuit are required, each actuation temporarily increases the current value of the feedback signal by 3 dB, resulting from the gain state change of the feedback signal adjuster (110). The feedback signal adjuster (110) is returned to its initial state each time the signal source (101) is reduced by 3 dB (as directed by the control circuit (108)).

The need for an overdrive protection mechanism involving control of the feedback signal adjuster (110) and the signal source (101) (by the control circuit (108)) arises as the result of modern transmitter architectures which employ complex non-constant envelope modulation and linear power amplifiers. Such power amplifiers incorporate transistors which are operated much below the maximum power levels which they are capable of delivering in order to avoid the non linearities incurred near their saturated power output limits. Under conditions of abnormal operation, this excess power capability becomes a liability in that amplifier elements (103 or 104), may now drive succeeding stages (105) to destruction. The signal feedback elements, summing junction (102), output signal sampling device (107), gain component (109), and feedback signal adjuster (110), are generally analog devices capable of rapid reaction times, whereas the signal source (101) is a digital signal processor (DSP) and associated filters which execute instructions at a known processor speed. When an abnormal operating condition is detected, the delay time required to produce a direct signal source reduction may consume several instruction cycles, allowing a potentially destructive condition to persist in the power amplifier. Configuring the drive power reduction initially in the fast-acting analog feedback elements, with a later transfer to digital control as described, produces a fast acting, stable protection mechanism.

Figure 2:
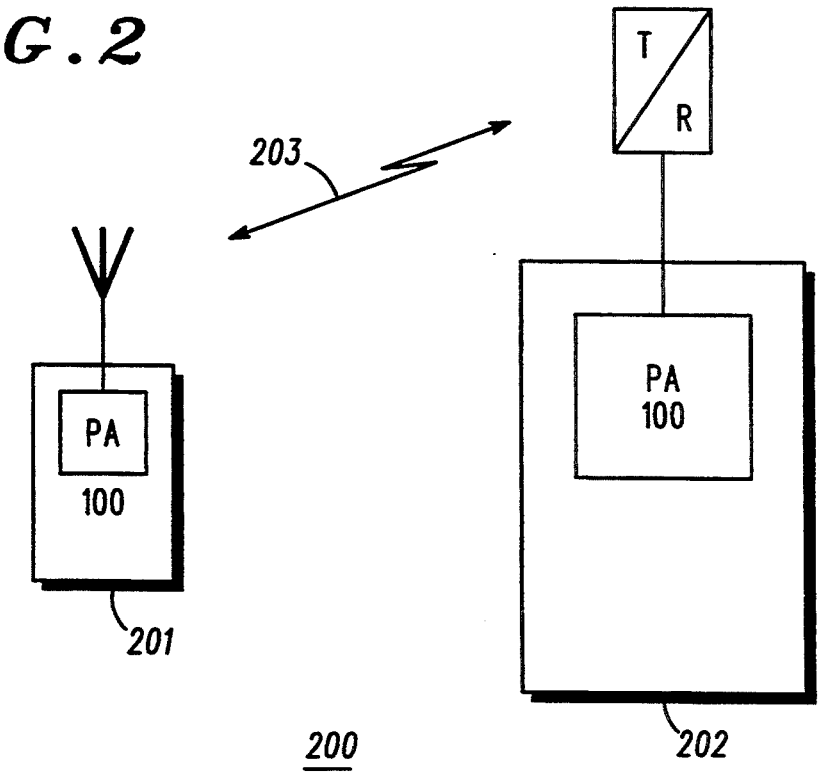
FIG. 2 illustrates a communication system in accordance with the present invention.

FIG. 2 illustrates a communication system (200) that comprises subscriber units (mobile or portable radio) (201) (one shown) and repeaters or base stations (202) (one shown). Further, the communication system (200) employs complex, non-constant envelope modulation requiring linear power amplifiers (100), present in both the subscriber unit (201) and the repeater (202). The power amplifier (100) in the subscriber unit (201) is typically a low power device, delivering 1–3 watts to its antenna. The power amplifier (100) in the base/repeater unit (202), generally operates at power levels exceeding 50 watts. Except for these operating power levels, the power amplifiers are functionally identical. The subscriber unit (201) and the base/repeater unit (202) may be components of a typical MIRS (Motorola Integrated Radio System) communication installation.

FIG. 3 illustrates a logic diagram that may be used to implement the present invention. To begin the process, the power amplifier output power level is sampled via any of several available techniques (300). A typical apparatus for this function may be a directional coupler or a voltage divider circuit. The sampled signal is processed by rectification and filtering to produce a sensing signal (301). The sensing signal is a DC voltage or current which bears a one-to-one relationship with the power amplifier output level, such that an increase in the power output level produces an increase in the sensing signal. Alternatively, the sensing signal may be derived from the level of DC current drawn by one of the power amplifier stages. In the most general case, the sensing signal indicates an abnormal operating condition by one of its properties (i.e.: voltage level, current level, etc) .

The sensing signal is compared to a DC reference level using known comparator art (302). The DC reference level is previously adjusted to define a threshold which, if exceeded by the sensing signal, indicates abnormal operation of the power amplifier. If the sensing signal has a value less than the threshold, no extraordinary action is taken. In the event the sensing signal exceeds the threshold, the gain state of the feedback signal adjuster is stored (303). If the feedback signal adjuster is an analog device, the storage device may be a sample-and-hold circuit which monitors the feedback signal adjuster's control line. Conversely, a memory device such as random access memory (RAM) may be used as the storage element if the feedback signal adjuster is controlled digitally.

Next, the feedback signal adjuster is activated to produce an increase in the level of the feedback signal (304). For realizations where the feedback signal adjuster is a controlled (variable) gain stage, the gain is increased. Where the feedback signal adjuster is an attenuator, the attenuation is decreased.

When the sensing signal exceeds the threshold (302), an alarm is activated (305) indicating that the power amplifier is operating in an adjusted state due to the output power level exceeding the reference level. The increased feedback signal generated (304) is applied to the summing junction of the feedback loop (306). At the summing junction, the input signal and the increased feedback signal are combined in opposite polarity, producing a subtraction of the signal values. The resultant signal, amplifier drive signal, (307) is applied as the drive signal for the power amplifier (308).

Since the level of the feedback signal has increased, the level of the drive signal applied to the power amplifier (308) has a reduced value relative to its value at the start of the process. The drive power reduction lowers the transmitter power output level to avoid possible damage to the power amplifier which may occur under abnormal operating conditions.

The power amplifier continues to operate in the reduced drive state awaiting a reset signal. The reset signal may be manual (309) or automatic after a predetermined period of time elapses (311). In either case, the reset action removes the alarm condition and returns the feedback signal adjuster to its previous state stored by either the sample-and-hold circuit or the memory location (310).

When neither a manual nor automatic reset has occurred, an alternative mode of operation may be chosen which entails adjusting the input signal source. If the input signal source is not to be adjusted (312), the power amplifier continues to operate in the reduced drive state awaiting a reset signal as described above. If the input signal source is to be adjusted, the modulation signal source level may be reduced proportionally to the feedback signal increase (313). Subsequently, the feedback signal adjuster is returned to its initial state as previously stored (314).

Finally, the output power level of the power amplifier is again sensed as the process repeats (300). This alternative mode of operation reduces or eliminates transmitter toggling between nominal and reduced drive states which would occur if the abnormal operating condition persists after reset. Operating at reduced drive continues in the alternative mode which, generally, eliminates the need to activate the protection circuit a second time. If a second activation is required, the source power will incur a second (cumulative) reduction making a third activation of the protection circuit unlikely. The transmitter power output ratchets down until the abnormal operating condition is no longer detected.

In some applications, a large drive power reduction may be necessary to avoid damage to the power amplifier. Stability constraints known in negative feedback art may, however, preclude the single large feedback signal level increase necessary to accomplish this reduction. Under these circumstances, the reduction may be achieved by repeated activation of the protection circuit. At each activation, the feedback signal adjuster temporarily increments the feedback signal in a step small enough to avoid instability, and returns to its initial state after the source signal has been decremented. A second activation produces the same result decrementing the source signal level further. This action continues until the abnormal operating condition is no longer detected. Such repeated activation of the protection circuit as necessitated by stability constraints extends the time required to achieve the final drive power reduction. However, the initial drive power decrement occurs sooner than had a single step reduction of the signal source been used to protect the power amplifier. Further, the drive reduction achieved by repeated activation of the protection circuit is the minimum reduction needed to remove the detected abnormal operating condition.

The present invention provides for an over power protection method and apparatus for use in power amplifiers, and in particular, for power amplifiers which incorporate negative feedback circuitry. Such power amplifiers are vulnerable to damage during their adjustment as the result of improper feedback parameter settings, as well as during normal operation due to variability of components. The present invention affords protection by providing a fast acting drive power reduction mechanism, activated only when abnormal operating conditions are detected. The power reduction mechanism is accomplished by varying feedback elements, and in conjunction with signal source control, avoids both toggling between drive levels and initiation of unstable operation modes.

I claim:

1. A method for protecting a power amplifier from excessive operating power levels, the method comprises the steps of:
    a) sensing output power of the power amplifier to produce a sensing signal;
    b) when the sensing signal exceeds a predetermined threshold, adjusting a feedback element to increase a feedback signal which produces an adjusted feedback signal;
    c) subtracting the adjusted feedback signal from an input signal to produce an amplifier drive signal; and
    d) supplying the amplifier drive signal to at least one power element of the power amplifier, wherein the output power is reduced proportional to the adjustment of the feedback element.

2. The method of claim 1 further comprises providing an alarm signal when the sensing signal exceeds the predetermined threshold.

3. The method of claim 2 further comprises, when a reset signal is asserted, resetting the adjusted feedback signal to a pre-adjusted feedback signal.

4. The method of claim 3 further comprises, when a predetermined period of time elapses, resetting the adjusted feedback signal to a pre-adjusted feedback signal.

5. The method of claim 1 further comprises, when a reset signal is asserted, resetting the adjusted feedback signal to a pre-adjusted feedback signal.

6. The method of claim 1 further comprises, when a predetermined period of time elapses, resetting the adjusted feedback signal to a pre-adjusted feedback signal.

7. The method of claim 1 further comprises the steps of:
    e) storing a pre-adjusted feedback signal of the feedback element prior to adjusting the feedback element;
    f) after the feedback element has been adjusted, adjusting a signal source to decrease the input signal, wherein the input signal is adjusted proportionally to the adjustment of the feedback element; and
    g) after the signal source has been adjusted, resetting the feedback element to the pre-adjusted feedback signal.

8. In a base station that contains a power amplifier, a method for protecting the power amplifier from excessive operating power levels, the method comprises the steps of:
    a) sensing output power of the power amplifier to produce a sensing signal;
    b) when the sensing signal exceeds a predetermined threshold, adjusting a feedback element to increase a feedback signal which produces an adjusted feedback signal;

c) subtracting the adjusted feedback signal from an input signal to produce an amplifier drive signal; and d) supplying the amplifier drive signal to at least one power element of the power amplifier, wherein the output power is reduced proportional to the adjustment of the feedback element.

9. The method of claim 8 further comprises providing an alarm signal when the sensing signal exceeds the predetermined threshold.

10. The method of claim 9 further comprises, when a reset signal is asserted, resetting the adjusted feedback signal To a pre-adjusted feedback signal.

11. The method of claim 10 further comprises, when a predetermined period of time elapses, resetting the adjusted feedback signal to a pre-adjusted feedback signal.

12. The method of claim 8 further comprises, when a reset signal is asserted, resetting the adjusted feedback signal to a pre-adjusted feedback signal.

13. The method of claim 8 further comprises, when a predetermined period of time elapses, resetting the adjusted feedback signal to a pre-adjusted feedback signal.

14. The method of claim 8 further comprises the steps of:

e) storing a pre-adjusted feedback signal of the feedback element prior to adjusting the feedback element;

f) after the feedback element has been adjusted, adjusting a signal source to decrease the input signal, wherein the input signal is adjusted proportionally to the adjustment of the feedback element; and g) after the signal source has been adjusted, resetting the feedback element to the pre-adjusted feedback signal.

15. In a radio that contains a power amplifier, a method for protecting the power amplifier from excessive operating power levels, the method comprises the steps of:

a) sensing output power of the power amplifier to produce a sensing signal;

b) when the sensing signal exceeds a predetermined threshold, adjusting a feedback element to increase a feedback signal which produces an adjusted feedback signal;

c) subtracting the adjusted feedback signal from an input signal to produce an amplifier drive signal; and d) supplying the amplifier drive signal to at least one power element of the power amplifier, wherein the output power is reduced proportional to the adjustment of the feedback element.

16. The method of claim 15 further comprises providing an alarm signal when the sensing signal exceeds the predetermined threshold.

17. The method of claim 16 further comprises, when a reset signal is asserted, resetting the adjusted feedback signal to a pre-adjusted feedback signal.

18. The method of claim 17 further comprises, when a predetermined period of time elapses, resetting the adjusted feedback signal to a pre-adjusted feedback signal.

19. The method of claim 15 further comprises, when a reset signal is asserted, resetting the adjusted feedback signal to a pre-adjusted feedback signal.

20. The method of claim 15 further comprises, when a predetermined period of time elapses, resetting the adjusted feedback signal to a pre-adjusted feedback signal.

21. The method of claim 15 further comprises the steps of:

e) storing a pre-adjusted feedback signal of the feedback element prior to adjusting the feedback element;

f) after the feedback element has been adjusted, adjusting a signal source to decrease the input signal, wherein the input signal is adjusted proportionally to the adjustment of the feedback element; and g) after the signal source has been adjusted, resetting the feedback element to the pre-adjusted feedback signal.

22. An apparatus for protecting a power amplifier from excessive operating power levels, wherein the power amplifier includes a feedback element that produces a feedback signal, a signal source that supplies an input signal, a mixer that subtracts the feedback signal from the input signal to produce a drive signal, and at least one power element, the apparatus comprises:

an output power sensor, wherein the output power sensor senses output power of the power amplifier to produce a sensing signal;

a feedback signal adjuster, operably coupled to the feedback element, wherein the feedback signal adjuster adjusts the feedback signal to produce an adjusted feedback signal when the sensing signal exceeds a predetermined threshold; and a control circuit, operably coupled to the output power sensor and the feedback signal adjuster, wherein the control circuit controls levels of adjustment of the feedback signal adjuster and determines when the sensing signal exceeds the predetermined threshold.

23. In the apparatus of claim 22, the control circuit is further operably coupled to the signal source and provides an adjustment signal to the signal source whereby the input signal is decreased when the sensing signal exceeds the predetermined threshold.

24. The apparatus of claim 22 further comprises an alarm generator that generates an alarm when the control circuit provides an alarm signal to the alarm generator, wherein the alarm signal is generated when the sensing signal exceeds the predetermined threshold.

* * * * *

UNITED STATES PATENT AND TRADEMARK OFFICE
CERTIFICATE OF CORRECTION

PATENT NO.    : 5,426,395
DATED         : June 20, 1995
INVENTOR(S)   : Lawrence F. Cygan It is certified that error appears in the above-identified patent and that said Letters Patent is hereby corrected as shown below:

Column 6, line 16, after "operating power levels" insert --by controlling the gain associated with forward and feedback elements in the closed loop--

Column 6, line 61, after "operating power levels" insert --by controlling the gain associated with forward and feedback elements in the closed loop--

Column 7, line 40, after "operating power levels" insert --by controlling the gain associated with forward and feedback elements in the closed loop--

Column 8, line 28, after "operating power levels" insert --by controlling the gain associated with forward and feedback elements in the closed loop--

Column 7, line 13, claim 10, "To" should read --to--.

Signed and Sealed this

Thirtieth Day of July, 1996

Attest:

BRUCE LEHMAN

*Attesting Officer*    Commissioner of Patents and Trademarks